United States Patent [19]

Roucek et al.

[11] Patent Number: 4,691,426
[45] Date of Patent: Sep. 8, 1987

[54] REPAIR OF STRIP CONDUCTOR ON ELECTRICAL CIRCUIT BOARD

[75] Inventors: Joseph A. Roucek, Apalachin; James R. Tessier, Owego, both of N.Y.

[73] Assignee: IBM Corporation, Armonk, N.Y.

[21] Appl. No.: 836,411

[22] Filed: Mar. 5, 1986

[51] Int. Cl.⁴ .............................................. B23K 1/00
[52] U.S. Cl. .................................. 29/402.18; 29/833; 29/847
[58] Field of Search ...................... 29/402.18, 833, 846, 29/847

Primary Examiner—Timothy V. Eley
Attorney, Agent, or Firm—Perman & Green

[57] ABSTRACT

Repair of defects in a printed circuit board, the defects including a break in a strip conductor and a short between two strip conductors, is accomplished by use of a milling machine cutter which is operated in a direction normal to a surface of the board to bring the cutter to a repair site at the defective conductor. The cutter is then advanced partway into the conductor and translated along the conductor in preparation for soldering of braze repairing a break or, alternatively, the cutter is advanced beyond the depth of shorting material after which translation along the surface serves to rout out shorting material. Transverse movement of the cutter also removes any coating which may be present on the circuit board, which coating need be removed prior to soldering or braze repair, and may be replaced after soldering or braze repair. A microscope and pellicule are positioned for aligning the cutter with the repair site. Repair is accomplished by a method including the establishment of an electric potential between a portion of the faulty conductor and the cutter, there being a change in voltage upon a contact of the cutter with the conductor, which change in voltage signals such contacting, thereby to allow for precise positioning of the cutter.

10 Claims, 2 Drawing Figures

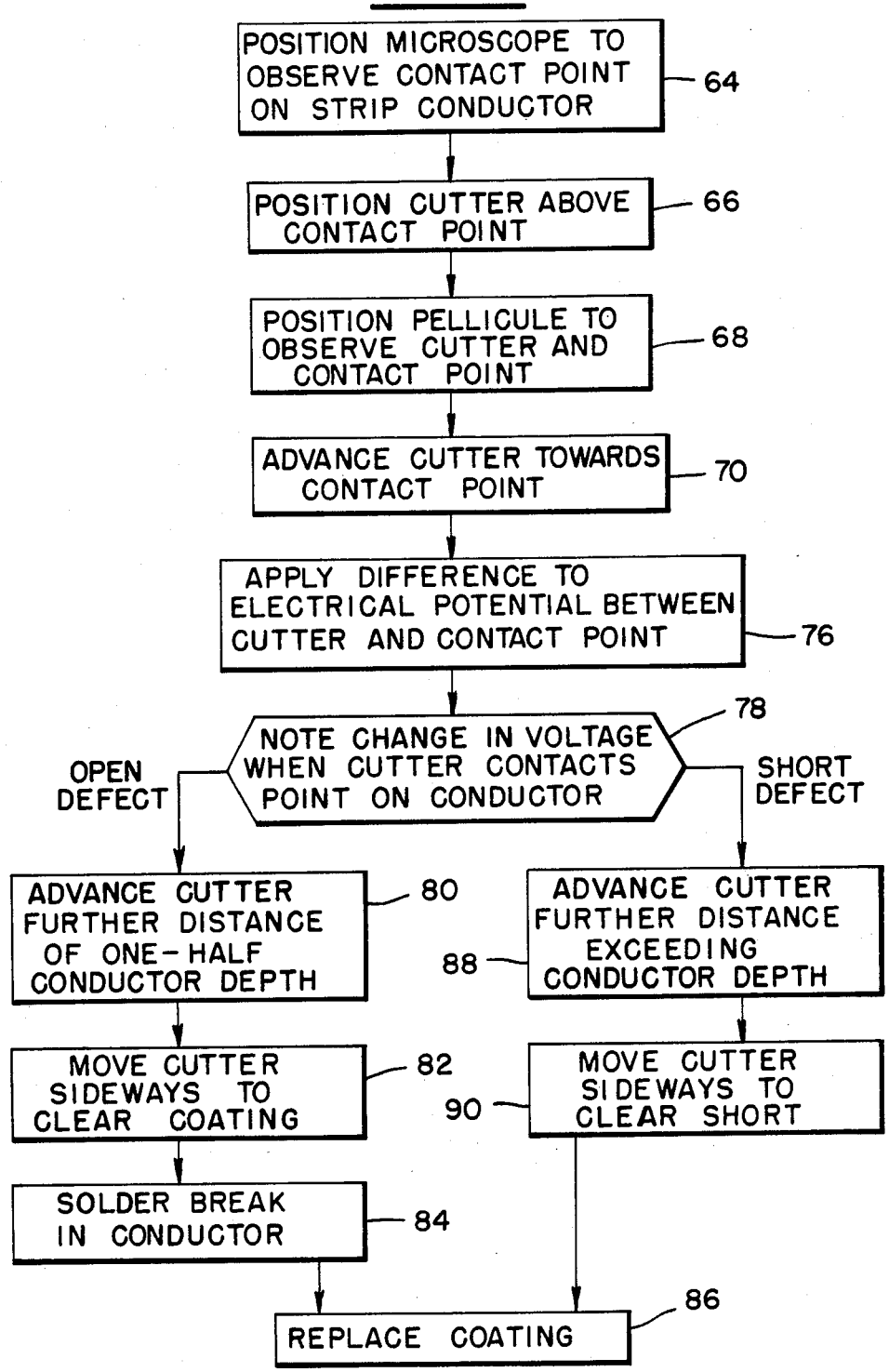

REPAIR OF STRIP CONDUCTOR ON ELECTRICAL CIRCUIT BOARD

BACKGROUND OF THE INVENTION

This invention relates to the repair of strip conductors on electrical circuit boards and, more particularly, to the use of electrical sensing of position, and to optical alignment of a milling cutter used in surface preparation for soldering or braze repair of conductor material and removal of shorting material between conductors.

In the manufacture of printed circuit boards, electrical conductors are formed of metal strips produced by photolithography upon an insulating substrate. The conductors connect electrical components mounted on the circuit board, and may also be connected with further conductors on the opposite side of the substrate by means of vias. Frequently, it is desirable to conserve space on the printed circuit boards by constructing the conductors to be as narrow as practical, and to position the conductors closely together.

A problem arises in that the photolithographic process may not be perfect. There may be a deficiency of plated metal at a point on a conductor resulting in a break in the conductor. Furthermore, excessive metal may be found between two neighboring conductors resulting in a short between the two conductors. Such a break or such a short can cause a circuit to malfunction, and necessitate repair if the circuit board is to be utilized. If the break or short cannot be repaired, then the circuit board must be scrapped.

Attempts to repair such shorts and breaks have been only marginally successful because of the tedium and exactness required in manually manipulating tools for the preparation of the surface of the board for a soldering operation to repair the break, and for the removal of the shorting material. The chance of a successful repair diminishes with decreasing width of conductor and decreasing spacing between neighboring conductors. A particular aspect of the problem is the difficulty in the alignment and positioning of a tool which is suitable for removal of shorting material between conductors, as well as the positioning and alignment of a tool which can remove a protective coating and clean a conductor surface prior to a soldering or brazing repair operation.

SUMMARY OF THE INVENTION

The foregoing problem is overcome and other features of the invention are provided by the use of an optical alignment device for guiding a milling cutter to a site on the circuit board wherein a repair is to be made, and also by the use of an electrical test circuit including a portion of a conductor to be repaired and the milling cutter to determine when the cutter has reached a surface of the conductor to be repaired. The alignment device includes a microscope directed towards the repair site and a pellicule disposed in the line of sight of the microscope to provide a person operating the microscope with a composite view of the milling cutter and the repair site on the circuit board. The composite view enables the operator to position the cutter directly above the repair site as the cutter is advanced to the repair site.

The electric circuit provides a signal when the cutter contacts metal of a conductor, such signal enabling the operator to determine when the cutter has broken through a protective coating on the board. Additional advancement of the cutter by a fraction of the thickness of a conductor strip cleans the surface of the strip, a transverse movement of the cutter along the strip cleaning an extended portion of the strip to prepare the strip for a conventional soldering or brazing repair process. Removal of shorting material is accomplished by advancing the cutter a distance slightly in excess of the depth of a conductor strip, a subsequent transverse movement of the cutter along the surface of the board providing for removal of excess metal from an extended region of the board for repair of a short circuit.

The invention is carried out by a sequence of method steps beginning with the positioning of a cutter near the repair site, and applying a voltage between the cutter and a portion of the conductor to be repaired. The point of contact between the conductor and the board at the repair site is then selected, and the cutter is guided towards the contact point under optical guidance of the microscope and the pellicule. The pellicule is constructed of a thin layer of glass which is partially silvered so as to provide for the direct viewing of the repair sight and the superposition of a reflected image of the cutter. As the cutter approaches the board, any protective coating which may be present is removed and, upon further movement of the cutter, electrical contact between the cutter and the conductor is established. The electrical contact between the cutter and the conductor produces a change in the voltage of the test circuit, which voltage change signals the contact of the cutter and conductor.

Thereupon, the repair of the break or the short proceeds as noted above. Thus, in the case of repair of the break, the cutter is employed to repair the surface for soldering or braze repair; and in the case of the short, the cutter is employed for routing out the excess metal of the short.

BRIEF DESCRIPTION OF THE DRAWINGS

The foregoing aspects and other features of the invention are explained in the following description, taken in connection with the accompanying drawing wherein:

FIG. 2 is a diagram showing steps of the invention for accomplishing a repair of the open circuit at the break in the conductor, and repair of the short between neighboring conductors.

DETAILED DESCRIPTION

Figure 1:
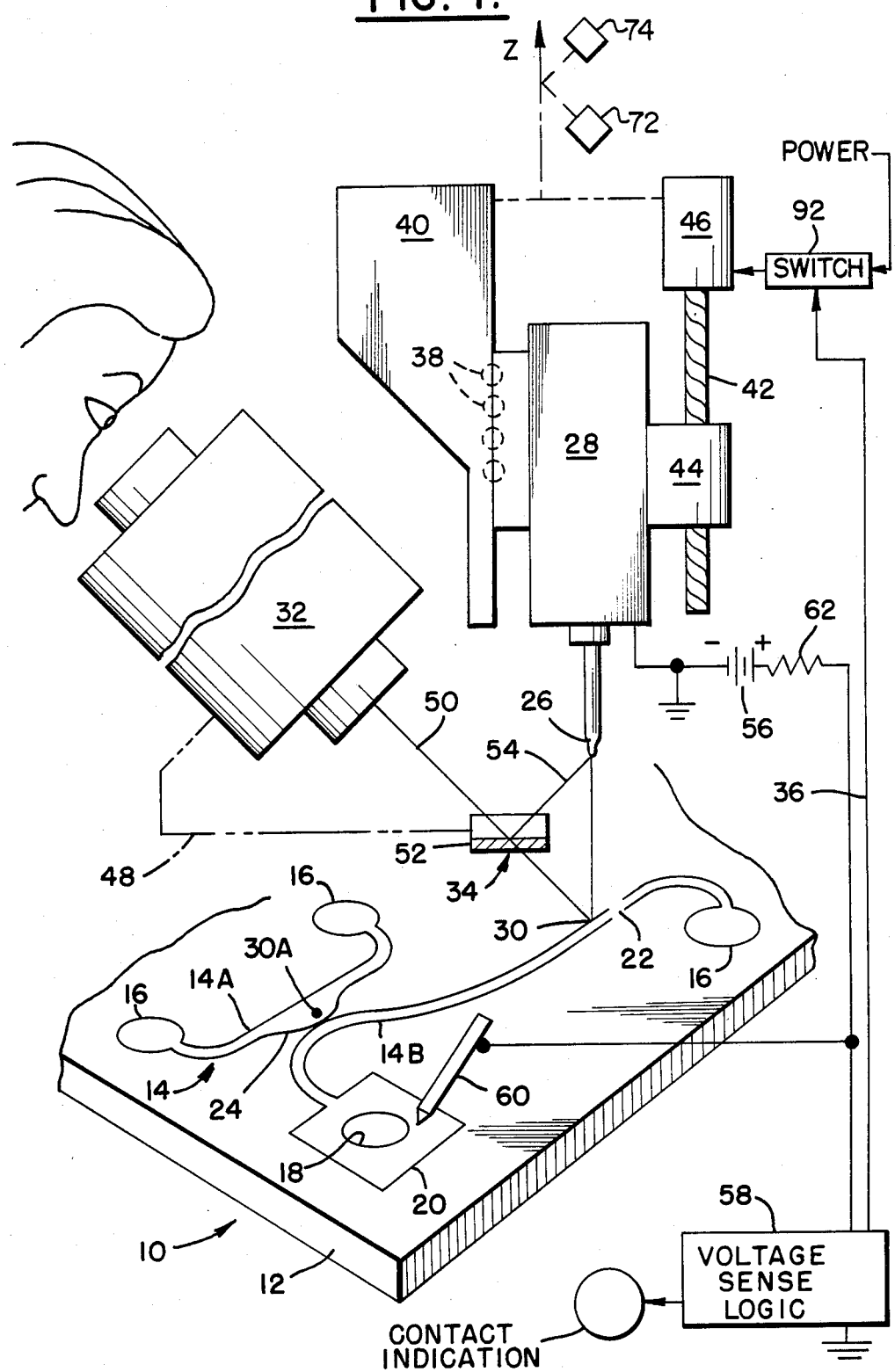
FIG. 1 is a stylized view of a printed circuit board having both a conductor break and a conductor short, the figure also showing the optical guiding of a milling cutter for use in repair of the short and the break.

FIG. 1 shows a circuit board 10 comprising an electrically insulating substrate 12 supporting strip conductors 14, individual ones of the conductors 14 being further identified by the legends 14A and 14B. The conductors 14 make electrical connection by means of vias 16 with other conductors (not shown) disposed on the opposite surface of the substrate 12. Also shown is a through hole 18 which passes through the substrate 12, the through hole having a land 20 which connects to an end of the conductor 14B. The opposite end of the conductor 14B connects with one of the vias 16. The conductor 14A is shown connected between two of the vias 16.

FIG. 1 illustrates two forms of defects which may occur in a printed circuit board. One of these defects is an open circuit or break 22 shown in the conductor 14B.

A second form of defect, namely a short 24, is disposed between the conductors 14A and 14B. The short 24 is formed by excess metal extending from a side of the conductor 14A to contact the conductor 14B. By way of example, the material of the conductors 14A and 14B may be copper or brass.

In accordance with the invention, the foregoing defects are to be corrected with the aid of a cutter 26 of a milling machie 28, the cutter 26 being guided towards a repair site 30 under optical guidance of a microscope 32 and a pellicule 34. Contact between the cutter 26 and a conductor 14 is established by means of an electric test circuit 36 connecting between the cutter 26 and a conductor 14. For repair of the break 22, the repair site 30 is located on the conductor 14B adjacent the break 22, and the electric circuit 36 connects with the conductor 14B, as shown in FIG. 1. For repair of the short 24, the repair site is moved to the location, indicated at 30A, of the short 24.

The milling machine 28 is held slideably via bearings 38 to a supporting frame 40. The milling machine 28 is displaceable in a vertical direction, relative to an upper surface of the board 10, which surface is horizontal, by means of a worm gear 42 connecting with a flange 44 of the machine 28. The gear 42 is rotatably driven by a motor 46.

The microscope 32 and the pellicule 34 are supported by a frame 48 indicated diagrammatically, the microscope 32 being directed along a line-of-sight 50 to the repair site 30, the line-of-sight 50 passing through the pellicule 34. The pellicule 34 includes a mirrored surface 52 oriented for reflecting a ray 54 from the cutter 26 back along the line-of-sight 50 to the microscope 32. The mirrored surface 52 is sufficiently thin so as to allow rays along the line-of-sight 50 to pass through the mirrored surface 52 for viewing the site 30.

The electric test circuit 36 comprises a battery 56, a voltage-sensing-logic unit 58, a probe 60, and a resistor 62. The resistor 62 serially connects one terminal of the battery 56 with one terminal of the logic unit 58. A second terminal of the battery 56 and a second terminal of the logic unit 58 are grounded. The probe 60 is connected to the junction of the resistor 62 and the logic unit 58. The housing of the machine 28 is also grounded. The machine 28 includes an electrically conductive bearing (not shown) which electrically connects the cutter 26 to the housing of the machine 28 during rotation of the cutter 26. Current flowing from the battery 56 via the resistor 62 to the logic unit 58 provides a voltage drop across the resistor 62 resulting in a nominal value of voltage across the logic unit 58. When the cutter 26 contacts the metal conductor 14B, the probe 60 is grounded through the conductor 14B and the cutter 26, the grounding reducing the nominal value of voltage at the first terminal of the logic unit 58 to zero. The reduction in voltage across the logic unit 58 signifies a contacting of the cutter 26 with the conductor at the repair site 30. In the event that the machine 28 is being used to repair the short 24, then the reduction in voltage across the logic unit 58 would indicate contact of the cutter 26 with the repair site 30A.

FIG. 2 shows the steps of a method for practicing the invention. First, as shown in block 64, the microscope 32 is positioned for observing the contact point at repair site 30 or 30A on the strip conductor 14B. Then, as shown in blocks 66, 68, and 70, the cutter 26 is positioned above the contact point at repair site 30 or 30A, the pellicule 34 is positioned for observation of both the cutter 26 and the contact point 30, and the milling machine 28 is positioned and operated for advancing the cutter 26 towards the contact point at repair site 30 or 30A. Alignment of the axis of the cutter 26, this being the z axis in FIG. 1, with the point of contact at the repair site 30 or 30A is obtained by means of x and y drive motors 72 and 74 shown connected diagrammatically to the frame 40 and the motor 46 in FIG. 1. Alternatively, a moveable table (not shown) may be employed for holding the circuit board 10, such moveable table including x and y drive motors for positioning the circuit board 10 relative to the axis of the cutter 26. After alignment of the axis of the cutter 26 with the repair site 30 or 30A, the pellicule 34 may be removed, if desired, to provide additional workspace for the milling machine 28. If desired, the pellicule 34 may be mounted on a slide mechanism (not shown) for slideable movement away from the line-of-site 50.

As shown in block 76, a difference of electric potential is applied between the cutter 26 and the contact point at the repair site 30 or 30A by means of the electric test circuit 36. If desired, the application of the voltage in block 76 may be performed prior to the positioning of the microscope 32 in block 64. The advancement of the cutter 26, shown in block 70, is continued until the cutter 26 breaks through any protective coating which may be present on the surface of the circuit board 10, whereupon electrical contact is established between the cutter 26 and the conductor 14B. This produces a change in voltage, at block 78, which change in voltage indicates contact between cutter 26 and conductor 14B.

The chart of FIG. 2 is bifurcated for repair of a defect of an open circuit, and for repair of a defect of a short circuit. With respect to the open circuit, blocks 80, 82, and 84 show a further advancement of the cutter 26 by a distance equal to one-half the depth of the conductor 14B. Typically, the conductor 14B may have a width of 5 mils and a depth of 1½ mils. The cutter 26 is advanced to one-half the conductor depth, typically ¾ mil, as indicated at block 80, after which the x-motor 72 and the y-motor 74 are activated to move the cutter 26 sideways to clear away additional portions of the protective coating, and also to clear away a portion of the strip conductor 14B, thereby to prepare the surface of the conductor 14B for soldering or braze repair. Soldering or braze repair is performed at block 84 to close the break in the conductor 14B. Thereafter, at block 86, additional protective coating may be applied at the repair site to protect the newly deposited metal at the break 22.

In the case of the repair of a defect from the short 24, the cutter 26 is positioned above the contact point at the site 30A, whereupon the cutter 26 is advanced a sufficient distance to penetrate the board 10 beyond the depth of the short 24 as indicated at block 88. Thereafter, at block 90, the cutter 26 is moved sideways, by operation of the x-motor 72 and the y-motor 74 to clear away the short 24. The thicknesses of the conductors 14A and 14B are approximately 5 mils wide. In removal of the short 24, a cutter depth is selected to be in excess of 1.8–2.0 mils beneath the protective coating surface. After removal of the short 24 by routing action of the cutter 26, the protective coating may be replaced, as has been indicated at block 86.

With respect to the operation of the electric test circuit 36, a value of voltage of 5 volts from the battery 56 is adequate for operation of the logic unit 58 for indicating contact between the cutter 26 and the strip conductor 14B. A value of resistance of 6800 ohms for the resistor 62 provides a suitable value of current for operation of the logic unit 58 for indicating the foregoing contact.

In the construction of the pellicule 34, it is noted that a thickness less than approximately 3 mils is preferred to militate against any objectionable secondary images, thereby to facilitate alignment of the cutter 26 with the repair site 30 or 30A. It is also noted that, with respect to the use of the probe 60, that contact of the probe 60 to the land 20 is made at a location wherein the land 20 is not covered with the protective coating. Typically, such coating is an epoxy coating.

As a further feature in the construction of the apparatus of FIG. 1, the logic unit 58 may be employed to operate a switch 92 for deactivating the motor 46 when contact is established with the conductor 14B, thereby providing the operator with an opportunity to precisely position the cutter 26 at a desired depth for use as a router. The switch 92 may be inserted on an input power line to the motor 46. The switch 92 is electronically controlled by an output signal of the logic unit 58 for haulting the advance of the cutter towards the board 10 when contact is made between the cutter and the conductor 14B; such halting may be done directly at the top surface of the conductor 14B or at a predetermined depth below the top surface.

With respect to the repairing of the short circuit at the site 30A, it may be desirable to employ a second probe (not shown) such that one of the probes is connected to the conductor 14B and the other of the probes is connected to the conductor 14A. During the routing of the shorting mafterial at the site 30A, the logic unit 58 would test for electrical continuity between the two probes. The loss of such continuity indicates complete removal of the shorting material by the cutter 26. This latter feature of the method of the invention may be employed in situations wherein it is difficult to optically monitor the extent of the short between the conductors 14A and 14B.

The foregoing apparatus and method provides for convenient and accurate repair of breaks and short circuits in strip conductors of printed circuit boards.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A method for correcting a defect in a plated electrical conductor on a circuit board comprising:
   positioning a cutter near the conductor;
   applying a voltage between the cutter and a portion of the conductor;
   selecting a contact point on said conductor portion to be contacted by the cutter;
   guiding the cutter towards said contact point under optical guidance;
   noting a change in said voltage upon a contacting of said cutter with said conductor at said contact point;
   advancing said cutter a predetermined distance beyond said contact point after the occurrence of said change in voltage to bring said cutter to said predetermined distance beyond said contact point; and
   correcting said defect, said correcting including a translating of said cutter relative to said conductor along a surface parallel to said conductor.

2. A method according to claim 1 wherein said defect is an open circuit, and said predetermined distance is approximately one-half the depth of said conductor.

3. A method according to claim 2 wherein said board has a coating and said translating clears the coating from a part of the conductor, thereby preparing a surface of the conductor for soldering or braze repair, said correcting further comprising a soldering or braze repair of a break in the conductor.

4. A method according to claim 3 wherein said step of correcting further comprises a step of replacing a coating at a site of said soldering or braze repair.

5. A method according to claim 1 wherein said defect is a short circuit, and wherein said predetermined distance exceeds the thickness of said conductor.

6. A method according to claim 5 wherein said translating clears away electrically conductive material from a site of said short circuit.

7. A method according to claim 6 wherein said board has a coating, and wherein said step of correcting further comprises a step of replacing the coating at a site of said short circuit.

8. A method according to claim 1 wherein said optical guidance includes a microscope directed along a line of sight toward said contact point, and a pellicule disposed in said line of sight, said step of guiding including a moving of said cutter toward said contact point while sighting both said cutter and said contact point in said pellicule.

9. A method according to claim 1 wherein said optical guidance includes a microscope directed along a line of sight toward said contact point, and a pellicule disposed in said line of sight, said step of guiding including a moving of said cutter toward said contact point while sighting both said cutter and said contact point in said pellicule; and wherein
   said defect is an open circuit, and said predetermined distance is approximately one-half the depth of said conductor; and wherein
   said board has a coating and said translating clears the coating from a part of the conductor, thereby preparing a surface of the conductor for soldering or braze repair, said correcting further comprising a soldering or braze repair of a break in the conductor.

10. A method according to claim 1 wherein said optical guidance includes a microscope directed along a line of sight toward said contact point, and a pellicule disposed in said line of sight, said step of guiding including a moving of said cutter toward said contact point while sighting both said cutter and said contact point in said pellicule; and wherein
    said defect is a short circuit, and wherein said predetermined distance exceeds the thickness of said conductor; and wherein
    said translating clears away electrically conductive material from a site of said short circuit.

* * * * *